United States Patent [19]
Makowiecki et al.

[11] Patent Number: 5,203,977
[45] Date of Patent: Apr. 20, 1993

[54] MAGNETRON SPUTTERED BORON FILMS AND TI/B MULTILAYER STRUCTURES

[75] Inventors: Daniel M. Makowiecki; Alan F. Jankowski, both of Livermore, Calif.

[73] Assignee: Regents of the University of California, Oakland, Calif.

[21] Appl. No.: 666,971

[22] Filed: Mar. 11, 1991

[51] Int. Cl.⁵ .............................................. C23C 14/35
[52] U.S. Cl. .......................... 204/192.15; 204/192.26; 204/192.27
[58] Field of Search ..................... 204/192.15, 192.26, 204/192.27

[56] References Cited
U.S. PATENT DOCUMENTS
4,177,474 12/1979 Ovshinsky ............................. 357/2

OTHER PUBLICATIONS
D. M. Makowiecki et al., *J. Vac. Sci. Technol.*, A8(6), Nov./Dec., 1990, pp. 3910–3913.

*Primary Examiner*—Aaron Weisstuch
*Attorney, Agent, or Firm*—L. E. Carnahan; Henry P. Sartorio

[57] ABSTRACT

A method is described for the production of thin boron and titanium/boron films by magnetron sputter deposition. The amorphous boron films contain no morphological growth features, unlike those found when thin films are prepared by various physical vapor deposition processes. Magnetron sputter deposition method requires the use of a high density crystalline boron sputter target which is prepared by hot isostatic pressing. Thin boron films prepared by this method are useful for ultrathin band pass filters as well as the low Z element in low Z/high Z mirrors which enhance reflectivity from grazing to normal incidence.

8 Claims, 3 Drawing Sheets

MAGNETRON SPUTTERED BORON FILMS AND TI/B MULTILAYER STRUCTURES

The United States Government has rights in this invention pursuant to Contract No. W-7405-ENG-48 between the U.S. Department of Energy and the University of California, for the operation of Lawrence Livermore National Laboratory.

FIELD OF THE INVENTION

The invention is related generally to thin films of low density materials and more particularly to amorphous thin films which are layered in a low Z/high Z (low atomic number/high atomic number) multilayer mirror.

BACKGROUND OF THE INVENTION

Thin foils are widely used as band-pass filters, in transmission filters, and in spectroscopic applications which use irradiation wavelengths in the range of extreme ultra-violet to soft x-rays. Submicron foils, 0.1–0.2 82 m thick, have been produced in various low Z materials (low atomic number) (i.e. carbon, beryllium) by sputtering and evaporation processes. Boron films, however, have been produced by resistance heating or electron beam evaporation (Labov, S. et al., *Applied Optics* 24: 576 (1985). Previous efforts to prepare boron foils by sputter deposition were precluded by the availability of dense, high purity sputter targets. Typically, sputtered films exhibit superior mechanical properties and are preferred because they have fewer defects and finer morphological growth features than foils prepared by evaporative processes.

Multilayered coatings, which are used as reflective layers in x-ray optics, are typically tens to hundreds of angstroms thick. A multilayer x-ray mirror is the analog of a quarter-wave stack reflective coating with the added complication of radiation absorption in the layers. Physically, it is an alternating sequence of thin films of highly absorbing and less absorbing materials deposited on an optically smooth substrate. The layered structure is periodic and results in a large angle, resonant reflectivity which is three or four orders of magnitude greater than the simple Fresnel reflection from an unlayered surface. Reflectivity in a multilayer mirror derives from the interference of x-rays coherently scattered from the interfaces between materials of higher or lower x-ray absorption.

The quality of the multilayered optical coating is determined by the perfection of the interfaces between the layers and the uniformity of the layer dimensions. Standard methods for application of multilayer coatings use the physical vapor deposition (PVD) process of evaporation or sputtering.

The coarse layer microstructure produced and the inherent difficulty in controlling the evaporation processes adversely affects the interface perfection and layer dimensional stability, and consequently, the efficiency of the optical coating produced by such methods. The use of computer controlled sputtering processes allows the production of complex multilayer coatings with variable layer thickness and composition.

SUMMARY OF THE INVENTION

Accordingly it is an object of the invention to provide a method for forming thin, amorphous boron films which have no morphological growth features.

It is another object to provide a method for forming thin multilayer structures which comprise thin boron films.

It is a further object of the invention to provide thin, amorphous boron films which have no morphological growth features.

It is another object of the invention to provide multilayer structures which comprise thin boron films with titanium or other high Z metal interlayers.

The invention provides a method to produce thin boron foils which do not include any morphological growth features such as columnar boundaries. These ultra-thin films can be produced as free-standing filters which do not require a protective or supportive layer, such as carbon-hydrogen based polymer films, which would reduce or contaminate the transmitted radiant energy intensity.

A foil is a very thin sheet of metal, which is usually not thicker than 0.15 mm. A thin film is a material which may be on a substrate, with a thickness not greater than 10 $\mu$m and uniformity within 20% of its average value. In the instant application, the terms thin film of metal, or thin film and the term foil will be used interchangeably to represent one layer of a particular metal which may be selected from a range of metal thicknesses. In the instant application, low Z refers to metals with an atomic number of 20 or less, and high Z refers to any of a group of metals with an atomic number greater than 20. which includes transition metals, refractory metals and noble metals.

The stability of the amorphous sputter-deposited boron suffices for the formation of layered structures even in the reactive and energetic Ti-B binary system. With the use of these thin boron layers as the non-absorbing low Z (low atomic number) layer in high Z/low Z multilayer structures or mirrors, it is possible to further reduce the absorption of such mirrors below that which is attainable with other low Z layers, such as carbon or boron carbide ($B_4C$) layers. This thin boron layer fabrication technique is applicable to production of multilayer mirrors for use with a wide range of optical wavelengths.

The fabrication of boron foils, films and multilayered structures has, previously, not been possible because of the problem of securing sufficiently dense, high purity boron to serve as a target for sputter deposition. A suitable target is now available as a high density, crystalline boron prepared by a method described by Hoenig et al. in Proceedings of the Seventh CIMTEC World Ceramics Congress, Montecatini-Terme, Italy, Jun. 24–28, 1990, published by Elsevier, The Netherlands, which is incorporated by reference. With this high density target material, it is possible to adequately control the sputtering process so that uniform thin amorphous boron foils, films and multilayer structures, can be produced.

DETAILED DESCRIPTION OF THE PREFERRED EMBODIMENTS

Figure 1:
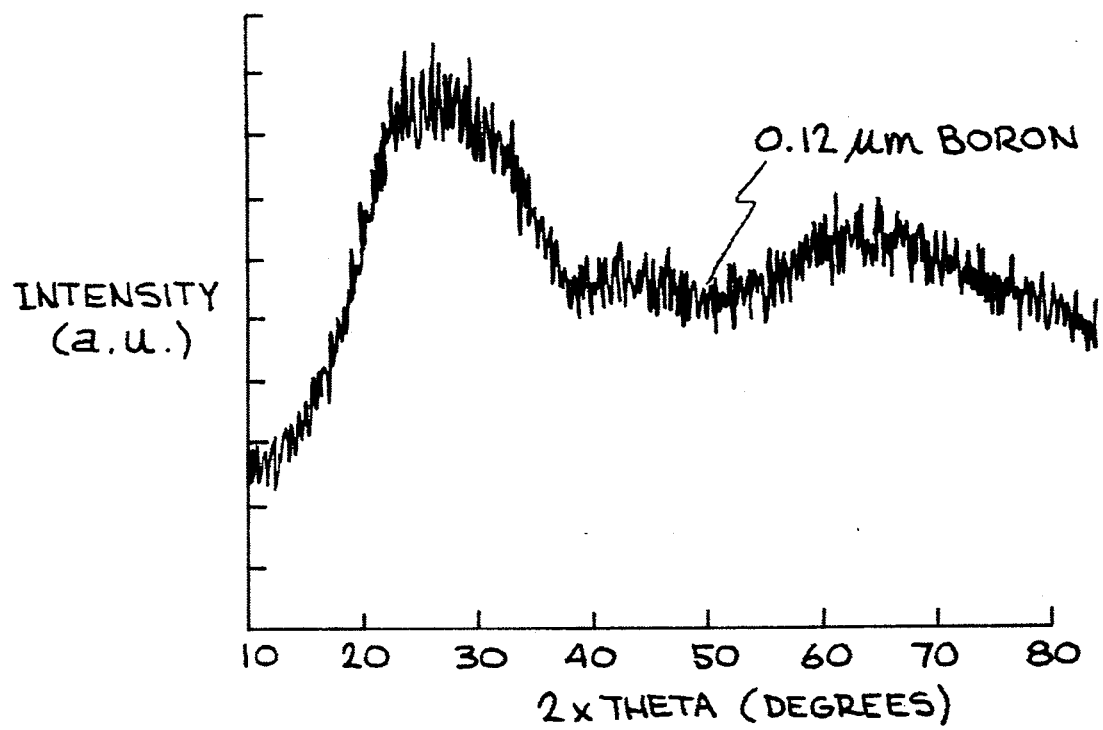
FIG. 1 is an x-ray diffraction scan ($CuK_\alpha$ high angle 0/20 scan) of a 0.12 $\mu$m-thick sputter deposited boron foil which lacks any evidence of crystallinity.

The invention is a method for forming thin, amorphous boron films and the thin amorphous layers produced thereby. Quality thin films are produced by a sputtering process which uses dense boron sputtering targets, particularly high density, crystalline boron sputtering targets, which are available through a hot isostatic pressing technique. The sputtering occurs by the attraction of ions created by electrons trapped in the magnetic field of the magnetron sputter source to the dense target material. Multilayer structures, for use as mirrors, may be fabricated by the use of a multihead magnetron sputter system in which all process parameters are controlled through active feedback. For mirror formation, the mounted low Z and high Z targets undergo rotation during the sputter deposition process to ensure development of uniform layers.

The magnetron sputter deposition process is performed in an evacuated chamber which is cryogenically pumped to a base pressure of about $10^{-5}$-$10^{-6}$ Pa. In the preferred mode, a base pressure of $6.7 \times 10^{-6}$ Pa is selected. To initiate the sputtering process, the atmosphere of the reaction chamber is filled with an inert gas, including but not limited to argon, helium, neon, krypton, and xenon. In the preferred mode argon gas is used, at a working pressure of about $6.7 \times 10^{-1}$ Pa. The magnetron sputtering source is run in the rf (radio frequency) mode, because the high density boron is an electrical insulator. The substrate, which is to receive the thin film is held at room temperature and is positioned directly above the magnetron sputtering source. The deposition process is similar to that described in Makowiecki, D. M. et al. in *J. Vacuum Science Technology A* 8(6): 3910-3913 (1990), which is incorporated by reference.

Previous attempts to use boron in a sputtering deposition process were limited by the availability of boron substrates which could be found only in powders or in thin layers. The pure dense boron sputtering targets were fabricated by a hot isostatic pressing technique such as that described in the previously cited Hoenig et al. reference. Briefly, pure boron powder (99.9%) was vacuum sealed in a tantalum can by electron beam welding and then hot isostatically compacted at a temperature of 1700° C. and a pressure of 0.21 GPa argon gas. After removal of the tantalum can, standard ceramic machining techniques were used to fabricate sputtering targets from the monolithic piece of boron. The crystalline boron product has a near theoretical density (2.36 g/cc) and an isotropically uniform microstructure. The high crystalline rehombohedral boron target used in carrying out this invention has a bulk density greater than 2.22 g/cc, preferably about 2.34 g/cc.

Thin boron films are sputtered onto any of a variety of substrates at room temperature. The receiving substrate can be any of a variety of quartz or glass substrates, including but not limited to NaCl-coated float glass. The film produced has a thickness of less than 10 μm, preferably in the range of 1.0-2.0 μm.

A magnetron sputter deposition process used to fabricate the multilayer structures, was similar to that described in Jankowski, A. F. et al. in *SPIE Conference Proceedings* 984: 64-74 (1988), which is incorporated by reference. The deposition apparatus comprised a rotating carrousel of water-cooled substrates which passed sequentially over an array of sputtering target materials. The magnetron sources were arranged so that each layer deposition would be followed by an alternate layer material. The magnetron sputter guns, with the high Z materials operated in a DC mode using a solid-state power supply, about 1 to 10 Kw, and were arranged in a circular array beneath the substrate table. The substrate table was rotated, which provided continuous repeating movement of the substrates over the center of each magnetron gun. Typical rotation frequencies ranged from about 0.001 to 0.02 sec$^{-1}$. The sputter deposition rates were found to vary linearly with the power supplied to the magnetron gun.

Such a deposition apparatus is suitable for sputtering with a variety of high Z target materials including, but not limited to titanium, refractory metals, noble metals, or transition metals, interspersed between dense low Z target materials, including, but not limited to, boron, beryllium, carbon, and boron carbide. The sputtering process takes place in an inert gas atmosphere, which could include helium, neon, krypton, xenon and argon, with argon preferred in particular. Cryogenic pumping was used to maintain the inert gas pressure in the range of about 2 to $15 \times 10^{-1}$ Pa. The receiving substrate was masked on an oxygen-free substrate table and kept at room temperature. The target to substrate distance was about 2-20 cm. The multilayer structures produced contained 50-100 layers with a nominal repeat sequence of 7-10 μm.

The multilayered structures were characterized by several techniques, including x-ray diffraction (XRD), transmission electron microscopy (TEM), and Auger electron spectroscopy (AES).

The layer pair spacings of the multilayer structures were measured at grazing incidence using a standard powder diffractometer operated in the θ/2θ mode.

Electron diffraction provided complementary information to that obtained via x-ray diffraction to determine the crystalline state of a thin film.

Atomic concentration profiles of the multilayers are measured with Auger electron spectroscopy (AES) profiling.

EXAMPLES

1. Formation of Boron Films

A boron film of approximately 0.12 μm thickness, was produced by sputtering high density boron onto a NaCl-coated float glass substrate at room temperature. The coated glass substrate was prepared by thermally evaporating NaCl onto glass, which was precleaned using a detergent, deionized water and an alcohol rinse, and dried with argon gas. The substrate temperature for the NaCl evaporation was 23° C. The high density crystalline boron target was rf magnetron sputtered at 400 watts in a 1.8 Pa argon atmosphere. The thin boron film was deposited at a rate of 0.1 nm/sec. when the target to substrate separation was 7 cm. The base pressure of the cryogenically pumped system after heating the interior to 80° C. for several hours was $5.3 \times 10^{-5}$ Pa.

2. Formation of Ti/B Multilayers

A typical multilayer deposition system was used to make Ti/B multilayers. The magnetron sputtering target sources were arranged on the apparatus so that the deposition of a boron layer would be immediately followed by deposition of a titanium layer. The system base pressure was $1.3 \times 10^{-5}$ Pa, whereas the multilayer deposition used an argon gas pressure of 2.1 Pa. A rotating frequency of 0.17 rpm was used for the sequential deposition. The titanium and boron target sources were operated at 120–250 and 375–400 watts, respectively. The boron source was run in the rf mode, whereas the titanium source was run in the dc mode. The size of the Ti/B multilayers sputter deposited are listed on Table I. The physical thickness of the titanium and boron layers were determined by crystal monitor readings determined with diamond stylus profilometry.

TABLE I

Boron Foil and Ti/B Multilayer Dimensions

| Sample No. | No. of Layers | Layer Thickness Ti (nm) | Layer Thickness B (nm) |
|---|---|---|---|
| 1-89-08 | 64 | 2.9 | 5.8 |
| 1-89-09 | 100 | 6.6 | 3.5 |
| 1-89-17 | 100 | 4.6 | 8.4 |
| 1-89-16 | 20 | — | 6.2 |

3. X-ray Diffractive Character of the Ti/B Multilayers

X-ray diffractive scans of the multilayer structures were typified by a nominal 8.7 nm repeat period of the Ti/B multilayer, for sample #1-89-08, which is shown in Table I. Five orders of reflection at grazing incidence were detected using a 40 KV, 40 mA beam. The repeat periods measured, corresponding to each order of reflection, n, (uncorrected for refraction) are listed in Table II. The number of reflections decreases as the titanium layer thickness increases. The measurements of the layer pair spacings are consistent with the deposition thickness parameters of Table I.

TABLE II

Measured Ti/B Layer Pair Spacings $d_n$ (nm)

| Sample No. | n = 1 | 2 | 3 | 4 | 5 |
|---|---|---|---|---|---|
| 1-89-08 | 78.6 | 86.4 | 85.9 | 86.8 | 86.2 |
| 1-89-09 | 88.4 | | | | |
| 1-89-17 | 98.1 | 110.0 | | | |

When the Ti/B multilayer structures with titanium layers greater than 4 nm thick were examined for the extent of crystallization with a high angle lens, there was some suggestion of microcrystalline titanium. The diffuse peak corresponding to a 0.228-nm planar spacing coincides with the high temperature beta phase of titanium in its closest packed orientation [(110)bbc]. No evidence of crystallization was evident for the boron layers or for the 0.12 um-thick boron foil, as shown in the diffraction scan of FIG. 1.

4. Transmission Electron Microscopy

Figure 2A:
FIG. 2 is transmission electron microscopy (TEM) images of 0.12 $\mu$m thick boron foil which shows lack of any growth morphology (e.g. columnar grains) or crystallinity in bright field (FIG. 2a) or dark field (FIG. 2b) images.
Figure 2B:
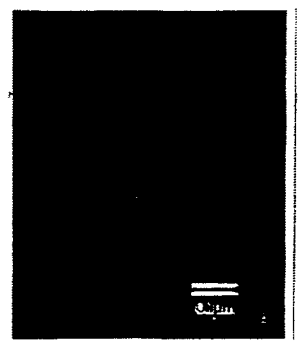

The plane surface of the 0.12-μm thick boron foil was examined by transmission electron microscopy in plane view in both bright-field (BF) and dark-field images (FIGS. 2a and 2b). There was no evidence of growth morphology such as columnar grains or crystallinity.

Figure 3:
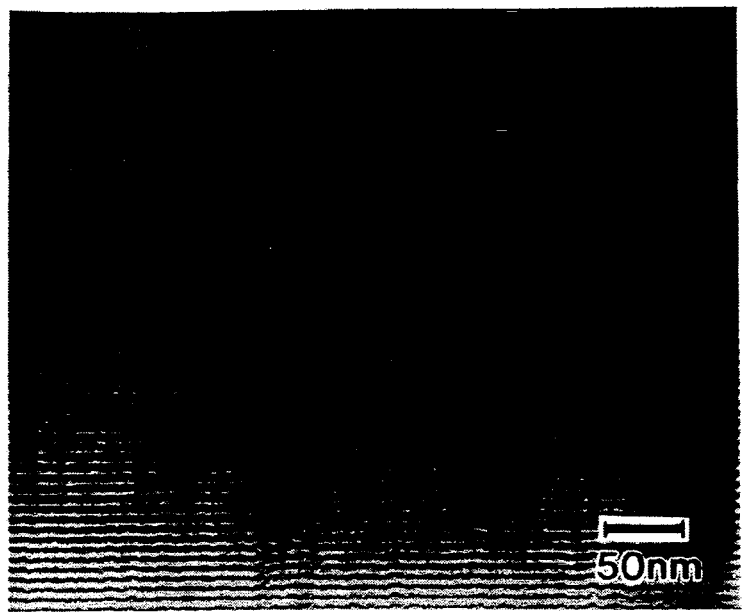
FIG. 3 is a transmission electron microscopy (TEM) bright-field image of a cross-section of the 8.7 nm Ti/B multilayer. The dark bands are titanium layers.
Figure 4:
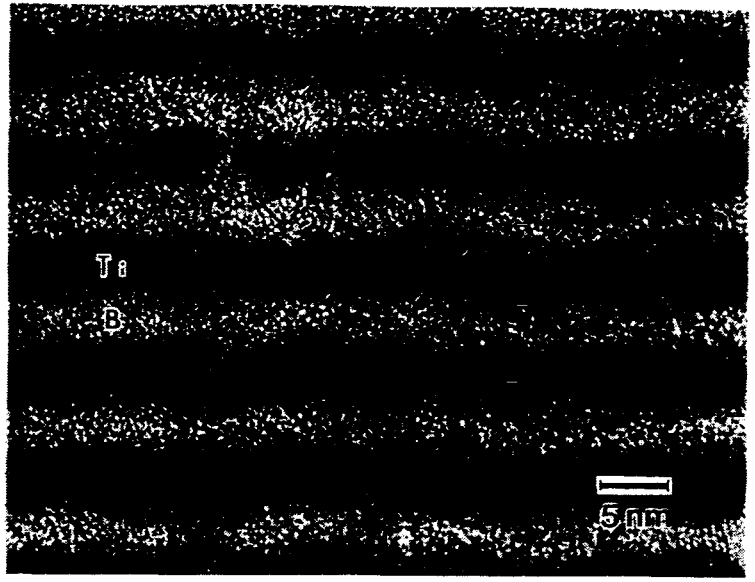
FIG. 4 is a high resolution electron micrograph of the multilayer structure of FIG. 3, showing the amorphous nature of the titanium and boron layers.

Microscopy of the cross-sections of Ti/B multilayers, by standard techniques, reveals the growth morphology of the sputtered deposits. The multilayers are characterized by a dense columnar structure, wherein the layers are continuous from one columnar grain to the next. This structure is shown in the TEM bright field image of the 8.7 nm Ti/B multilayer of sample #1-89-08 in FIG. 3. High resolution imaging discloses the extent of the microcrystallinity as well as the interface interaction. The titanium and boron layers are completely amorphous, as is demonstrated in FIG. 4, which is a high resolution micrograph of the structure of the multilayer of FIG. 3. The Ti-B and B-Ti interfaces appear identical with an approximate roughness of less than 0.7 nm.

5. Auger Electron Spectroscopy

Figure 5:
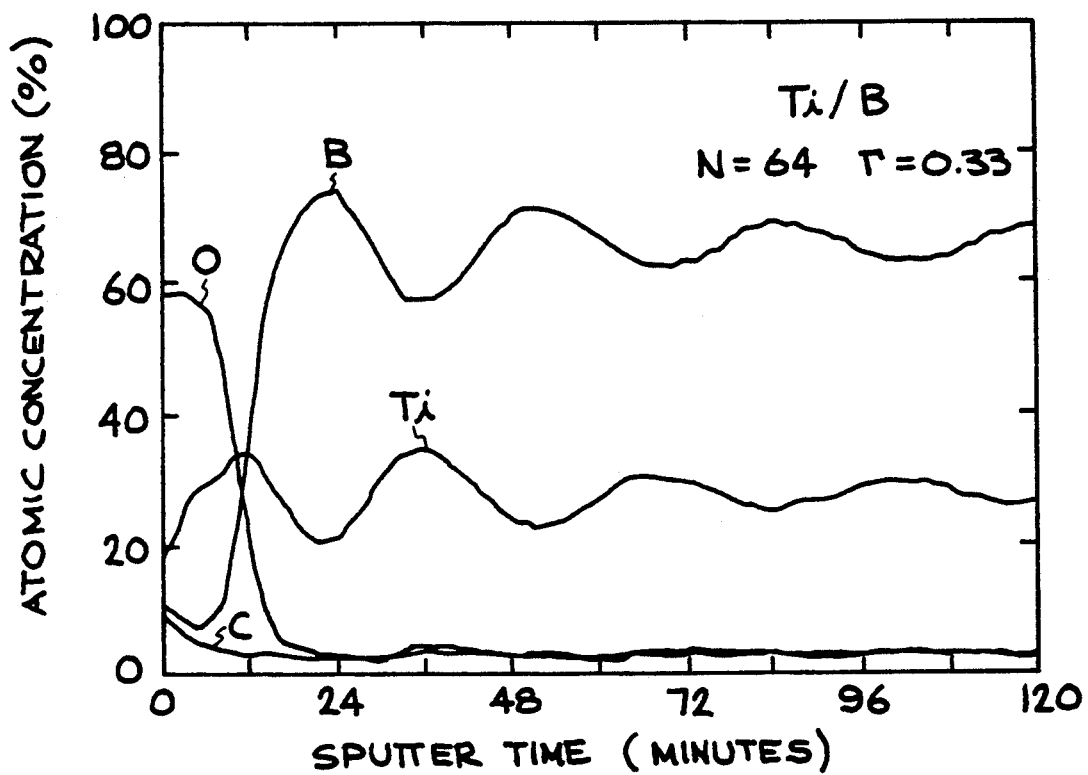
FIG. 5 is an atomic concentration profile, by Auger Electron Spectroscopy (AES), of the titanium-boron multilayer structure shown in FIG. 3.

Using Auger electrons generated at 3 KeV, 10 μA electron beam, the atomic concentrations could be calculated from the 417 eV titanium peak, the 179 eV boron peak, the 272 eV carbon peak and the 503 eV oxygen peak. A 2 KeV 0.53 μA argon ion beam was used to sputter etch a 25 mm$^2$ area of the sample surface, at $4.0 \times 10^{-3}$ Pa, while the system base pressure was held below $6.6 \times 10^{-8}$ Pa. The surface carbon and oxygen contaminations are removed during the depth profile etching (FIG. 5). The titanium and boron concentrations rise and fall sequentially during sequential sputtering away of each layer. The average value for each component is in agreement with the multilayer dimensions shown in Table I.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for forming thin amorphous boron films which have no morphological growth features; comprising:
   subjecting a boron target having a density near theoretical density to an rf magnetron sputtering process; and
   depositing a thin amorphous film of sputtered boron on a substrate material.

2. A method as in claim 1, wherein said boron target is high density crystalline boron.

3. A method as in claim 2, wherein said boron target is high density crystalline rhombohedral boron having a bulk density greater than 2.22 g/cc.

4. A method as in claim 3, wherein said boron target is high density crystalline rhombohedral boron having a bulk density of about 2.34 g/cc.

5. A method for forming thin amorphous boron multilayer structures, comprising:
   subjecting a boron target having a density near theoretical density to an rf magnetron sputtering process;
   depositing a thin amorphous film of sputtered boron on a substrate material;

subjecting a second target material to a magnetron sputtering process; and depositing a thin layer of sputtered second target material on said thin amorphous boron film.

6. The method as in claim 5, wherein said second target material is high-absorbing high atomic number metal material.

7. The method as in claim 6, wherein said second target material is selected from the group consisting of titanium, transition metals, refractory metals, and noble metals.

8. The method as in claim 7, wherein said second target material is titanium.

* * * * *